(12) United States Patent
Chakraborty

(10) Patent No.: US 8,101,443 B2
(45) Date of Patent: Jan. 24, 2012

(54) LEDS USING SINGLE CRYSTALLINE PHOSPHOR AND METHODS OF FABRICATING SAME

(75) Inventor: Arpan Chakraborty, Goleta, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/961,789

(22) Filed: Dec. 7, 2010

(65) Prior Publication Data

US 2011/0073881 A1 Mar. 31, 2011

Related U.S. Application Data

(62) Division of application No. 12/082,444, filed on Apr. 10, 2008, now Pat. No. 7,859,000.

(51) Int. Cl.
*H01L 33/00* (2010.01)
(52) U.S. Cl. ............ 438/29; 438/22; 438/47; 257/98; 257/79; 257/94; 257/E33.06; 257/E33.061
(58) Field of Classification Search .......... 438/22, 438/29, 47, 41, 45, 46; 257/79, 94, 98, E33.06, 257/E33.061
See application file for complete search history.

(56) References Cited

U.S. PATENT DOCUMENTS

| | | | | |
|---|---|---|---|---|
| 4,946,547 | A | 8/1990 | Palmour et al. | 156/643 |
| 5,200,022 | A | 4/1993 | Kong et al. | 156/612 |
| RE34,861 | E | 2/1995 | Davis et al. | 437/100 |
| 5,959,316 | A | 9/1999 | Lowery | 257/98 |
| 6,630,691 | B1 | 10/2003 | Mueller-Mach et al. | 257/84 |
| 2004/0212295 | A1* | 10/2004 | Yin Chua et al. | 313/503 |
| 2005/0006659 | A1 | 1/2005 | Ng et al. | |
| 2005/0269582 | A1 | 12/2005 | Mueller et al. | |
| 2006/0113553 | A1 | 6/2006 | Srivastava et al. | |
| 2007/0176531 | A1 | 8/2007 | Kinoshita et al. | |
| 2007/0241355 | A1 | 10/2007 | Chua | |
| 2008/0023719 | A1 | 1/2008 | Camras et al. | |
| 2008/0042153 | A1* | 2/2008 | Beeson et al. | 257/94 |
| 2009/0065790 | A1* | 3/2009 | Chitnis et al. | 257/88 |
| 2009/0140272 | A1* | 6/2009 | Beeson et al. | 257/89 |
| 2009/0236619 | A1* | 9/2009 | Chakroborty | 257/89 |
| 2009/0256163 | A1* | 10/2009 | Chakraborty | 257/88 |
| 2010/0141172 | A1* | 6/2010 | Uchida et al. | 315/294 |

FOREIGN PATENT DOCUMENTS

EP 1198016 A2 4/2002

(Continued)

OTHER PUBLICATIONS

International Search Report and Written Opinion from related PCT Application No. PCT/US2009/002197, dated: Jul. 30, 2009.

(Continued)

*Primary Examiner* — Victor A Mandala
(74) *Attorney, Agent, or Firm* — Koppel, Patrick, Heybl & Philpott

(57) ABSTRACT

Methods for fabricating LED chips from a wafer and devices fabricated using the methods with one method comprising depositing LED epitaxial layers on an LED growth wafer to form a plurality of LEDs on the growth wafer. A single crystalline phosphor is bonded over at least some the plurality of LEDs so that at least some light from the covered LEDs passes through the single crystalline phosphor and is converted. The LED chips can then be singulated from the wafer to provide LED chips each having a portion of said single crystalline phosphor to convert LED light.

40 Claims, 6 Drawing Sheets

FOREIGN PATENT DOCUMENTS

| | | |
|---|---|---|
| WO | WO2007023411 A | 3/2007 |
| WO | WO2007039849 A | 4/2007 |
| WO | WO2007063460 A | 6/2007 |
| WO | WO2007085977 A | 8/2007 |

OTHER PUBLICATIONS

Nichia Corp. White LED part No. NSPW312BS, Speciation for Nichia White LED, Model NSPW312BS, Jan. 14, 2004.

Nichia Corp. White LED part No. NSPW300BS, Speciation for Nichia White LED, Model NSPW312BS, Jan. 14, 2004.

XThin® LEDs, Data Sheet Cree LED Lighting, 2004, pp. 1-6.

Cree ® EZ1000™ LEDS Data Sheet, pp. 1, 2007.

Cree ® EZ290™ LEDS Data Sheet, pp. 1, 2007.

Cree ® EZ400™ TM LEDS Data Sheet, pp. 1-5, 2007.

Office Action from U.S. Appl. No. 12/082,444, mailed: Feb. 4, 2010.

Response to Office Action from U.S. Appl. No. 12/082,444, dated: May 4, 2010.

Notice of Allowance from U.S. Appl. No. 12/082,444, dated: Aug. 25, 2010.

* cited by examiner

LEDS USING SINGLE CRYSTALLINE PHOSPHOR AND METHODS OF FABRICATING SAME

This application is a divisional of, and claims the benefit of, U.S. patent application Ser. No. 12/082,444, to Chakraborty, filed Apr. 10, 2008 now U.S. Pat. No. 7,859,000, and having the same title as this application.

BACKGROUND OF THE INVENTION

1. Field of the Invention

This invention relates to solid state emitters, and in particular light emitting diodes (LEDs) utilizing one or more single crystalline phosphor for light conversion and methods of fabricating same.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). [See Nichia Corp. white LED, Part No. NSPW300BS, NSPW312BS, etc.; Cree® Inc. EZBright™ LEDs, XThin™ LEDs, etc.; See also U.S. Pat. No. 5,959,316 to Lowrey, "Multiple Encapsulation of Phosphor-LED Devices"]. The surrounding phosphor material "downconverts" the wavelength of some of the LED's blue light, changing its color to yellow. Some of the blue light passes through the phosphor without being changed while a substantial portion of the light is downconverted to yellow. The LED emits both blue and yellow light, which combine to provide a white light. In another approach light from a violet or ultraviolet emitting LED has been converted to white light by surrounding the LED with multicolor phosphors or dyes.

One conventional method for coating an LED with a phosphor layer utilizes a syringe or nozzle for injecting a phosphor mixed with epoxy resin or silicone polymers over the LED. Using this method, however, it can be difficult to control the phosphor layer's geometry and thickness. As a result, light emitting from the LED at different angles can pass through different amounts of conversion material, which can result in an LED with non-uniform color temperature as a function of viewing angle. Because the geometry and thickness is hard to control, it can also be difficult to consistently reproduce LEDs with the same or similar emission characteristics.

Another conventional method for coating an LED is by stencil printing, which is described in European Patent Application EP 1198016 A2 to Lowery. Multiple light emitting semiconductor devices are arranged on a substrate with a desired distance between adjacent LEDs. The stencil is provided having openings that align with the LEDs, with the holes being slightly larger than the LEDs and the stencil being thicker than the LEDs. A stencil is positioned on the substrate with each of the LEDs located within a respective opening in the stencil. A composition is then deposited in the stencil openings, covering the LEDs, with a typical composition being a phosphor in a silicone polymer that can be cured by heat or light. After the holes are filled, the stencil is removed from the substrate and the stenciling composition is cured to a solid state.

Like the syringe method above, using the stencil method can be difficult to control the geometry and layer thickness of the phosphor containing polymer. The stenciling composition may not fully fill the stencil opening such that the resulting layer is not uniform. The phosphor containing composition can also stick to the stencil opening which reduces the amount of composition remaining on the LED. The stencil openings may also be misaligned to the LED. These problems can result in LEDs having non-uniform color temperature and LEDs that are difficult to consistently reproduce with the same or similar emission characteristics.

Various coating processes of LEDs have been considered, including spin coating, spray coating, electrostatic deposition (ESD), and electrophoretic deposition (EPD). Processes such as spin coating or spray coating typically utilize a binder material during the phosphor deposition, while other processes require the addition of a binder immediately following their deposition to stabilize the phosphor particles/powder.

In these processes the phosphor is typically provided in powder (amorphous or polycrystalline or paracrystalline) form over the LEDs, with a particle size distribution similar to a Gaussian. The individual phosphor particles are usually crystalline but they tend to have physical defects like grain boundaries, etc. Also, the phosphor synthesis process tends to generate defects due to abrasion, milling, etc. The primary particle destruction lowers efficiency because the lattice defects created in the phosphor crystal act as nonradiative recombination centers, or that a nonluminescent, amorphous layer is formed on the surface of the particles. Furthermore, smaller phosphor particles can result in increased scattering related losses.

Further, the phosphor particles can be held in place over the LEDs using a binding material, such as silicones, epoxies, and the phosphor binder material can have a different index of refraction compared to the LED epitaxial material. This difference can reduce the emission cone through the phosphor binder with some of the LED light being lost due to total internal reflection (TIR).

SUMMARY OF THE INVENTION

The present invention discloses new methods for fabricating semiconductor devices, such as LED chips at the wafer level, and discloses LED chips, LED chip wafers and LED packages fabricated using the methods. One method according to the present invention for fabricating LED chips from a wafer comprises depositing LED epitaxial layers on an LED growth wafer to form a plurality of LEDs on the growth wafer. A single crystalline phosphor is bonded over at least some of the plurality of LEDs so that at least some light from the covered LEDs passes through the single crystalline phosphor and is converted.

Another method according to the present invention for fabricating LED chips from a wafer comprises depositing LED epitaxial layers on an LED growth substrate to form an LED wafer with a plurality of LEDs and bonding the LED wafer to a carrier wafer. The growth substrate can be removed and a single crystalline phosphor can be bonded over at least some of the plurality of LEDs so that some light from at least some of the LEDs passes through the single crystalline phosphor and is converted. The carrier wafer can then be removed.

One embodiment of an LED chip wafer according to the present invention comprises a plurality of LEDs on a wafer. A single crystalline phosphor is included at least partially covering at least some of the LEDs such that during operation of the covered ones of the LEDs at least some light from the LEDs passes through the single crystalline phosphor and is converted.

One embodiment of an LED chip according to the present invention comprising an LED and a single crystalline phosphor bonded to and at least partially covering the LED. At least some of the light emitted by the LED is converted by the single crystalline phosphor.

One embodiment of an LED package according to the present invention comprises an LED chip having an LED and a single crystalline phosphor at least partially covering the LED and converting at least some of the light from the LED. First and second contacts are included for applying an electrical signal to the LED. Package leads are also included in electrical connection with the first and second contacts. An encapsulation surrounds the LED chip and electrical connections.

These and other aspects and advantages of the invention will become apparent from the following detailed description and the accompanying drawings which illustrate by way of example the features of the invention.

DETAILED DESCRIPTION OF THE INVENTION

Figure 1:
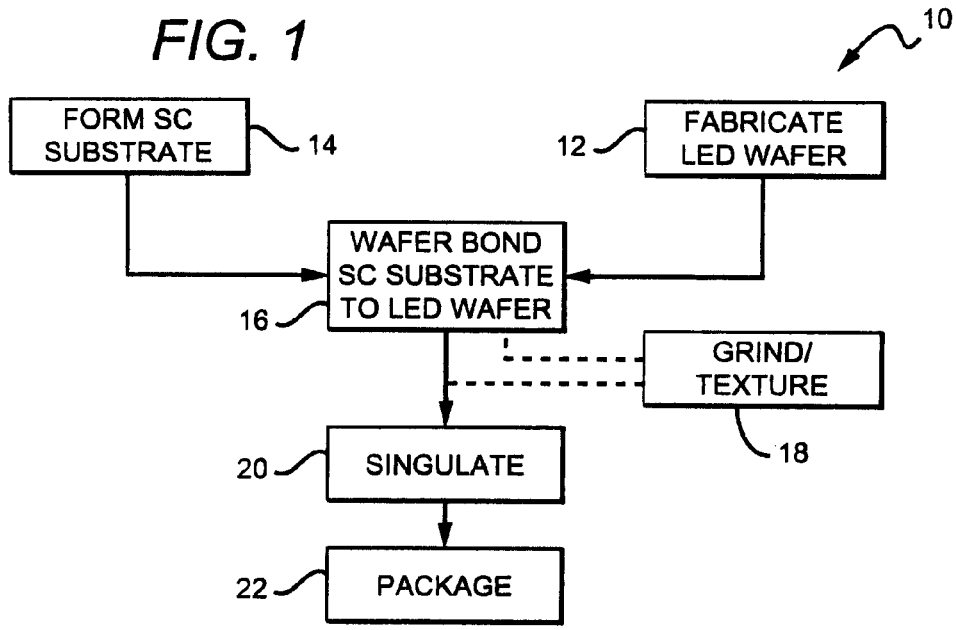
FIG. 1 shows a flow diagram for one embodiment of a method for fabricating LED chips according to the present invention.

The present invention is directed to LEDs utilizing single crystalline phosphor as the conversion material, and methods for fabricating the LEDs. The present invention is particularly applicable to fabricating wire-bond free, substrate free LEDs using wafer-bonding methods. The use of single crystalline phosphors allows for wafer level phosphor integration and minimizes scattering related emission losses, therein by improving package efficiency. Single crystalline phosphors are also compatible with wafer level fabrication utilizing techniques such as wafer bonding, and are robust enough to provide mechanical support for the LED epitaxial layers. This allows for wafer level fabrication of LEDs with the single crystalline phosphors acting as the carrier substrate. Single crystalline slabs can be formed substantially defect free and can bond to epitaxial materials or substrates.

The single crystalline phosphor substrate can comprise many different phosphor materials that can be engineered to absorb different wavelengths of LED light and re-emit different wavelengths of light. In a preferred embodiment the single crystalline phosphor substrate can absorb blue light having a wavelength in the range of 450 to 480 nm and re-emit a yellow light so that the overall light emission is a white light combination of blue LED light and yellow conversion material light. One such embodiment can utilize a single crystal YAG substrate as described below, doped with different materials such as Cerium. In other embodiments, more than one single crystal phosphor substrate can be used or the single crystal phosphor can have different regions doped with different materials.

Single crystalline phosphors experience reduced light scattering as a result of the ordered crystalline material structure. In previous phosphor application processes, the phosphor particles are in powder form with a certain particle size distribution, typically ranging from 1-20 µm, so that LED light encountering the particles can be scattered randomly, or in many different directions. For single crystalline phosphors, the LED light encounters a perfect and ordered single-crystalline material, so the LED light undergoes almost no scattering. The absence of scattering, or more importantly the absence of back-scattering, results in higher efficiency for the single crystalline phosphor.

The single crystalline phosphor also reduces light loss due to total internal reflection (TIR) at the semiconductor-phosphor layer interface. In previous phosphor application processes, the phosphor particles are in a binder that typically has a refractive index (RI) of approximately 1.5. The LED semiconductor material has an RI of approximately 2.5. Single crystalline phosphors, by comparison, have a homogenous RI of 1.7 or higher, which is greater than the binder material, and closer to the RI of the semiconductor material. As a result, the embodiments with a single crystalline phosphor will experience reduced TIR and scattering compared to LEDs utilizing a phosphor in binder as the conversion material.

The use of single crystalline phosphors provides further advantages, such as allowing singulating or dicing of individual LEDs from the wafer along the natural cleavage plane of the crystalline. It is understood, however, that in other embodiments known scribe and break processes can be used if not dicing on natural cleavage plane. In embodiments with contacts on one side no wire bonds are required, and because the single crystalline phosphors are robust, no carrier substrate is required for mechanical support of the LEDs. The LEDs according to the present invention are compatible with any substrate (SiC, GaN, sapphire) where growth substrate removal is possible. It is understood that single crystalline phosphors can also be used in the fabrication of individual LEDs or groups of LEDs, not just for wafer fabrication.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIG. 1 shows one embodiment of method 10 according to the present invention for fabricating LEDs, and although steps are being shown in a particular order it is understood that the steps can occur in a different order and different steps can be used. The present method is described with reference to the fabrication of LEDs, but it is understood that it can be used to fabricate other solid state emitters and other semiconductor devices.

In step 12 LEDs are fabricated on a growth wafer or substrate, and the LEDs can have many different semiconductor layers arranged in different ways. The fabrication and operation of LEDs is generally known in the art and only briefly discussed herein. The layers of the LEDs can be fabricated using known processes with a suitable process being fabrication using metal organic chemical vapor deposition (MOCVD). The layers of the LEDs generally comprise an active layer/region sandwiched between first and second oppositely doped epitaxial layers, all of which are formed successively on the growth wafer or substrate ("wafer"). The LED layers can initially be formed as continuous layers across the substrate with the layers then partitioned or separated into individual LEDs. This separation can be achieved by having portions of the active region and doped layers etched down to the wafer to form the open areas between the LEDs. In other embodiments the active layer and doped layers can remain continuous layers on the wafer and can be separated into individual devices when the LED chips are singulated.

It is understood that additional layers and elements can also be included in each of the LEDs, including but not limited to buffer, nucleation, contact and current spreading layers as well as light extraction layers and elements. The active region can comprise single quantum well (SQW), multiple quantum well (MQW), double heterostructure or super lattice structures, and as is understood in the art, the oppositely doped layers are commonly referred to as n-type and p-type doped layers.

The LEDs may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the n- and p-type layers are gallium nitride (GaN) and the active region is InGaN. In alternative embodiments the n- and p-type layers may be aluminum indium gallium nitride (AlInGaN), aluminum gallium arsenide (AlGaAs) or aluminum gallium indium arsenide phosphide (AlGaInAsP).

The wafer can be made of many materials such as sapphire, silicon carbide, aluminum nitride (AlN), GaN, with a suitable wafer being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the wafer (as may be the case with some devices formed on sapphire). SiC wafers are available from Cree Research, Inc., of Durham, N.C. and methods for producing them are set forth in the scientific literature as well as in a U.S. Pat. Nos. Re. 34,861; 4,946,547; and 5,200,022.

Each of the LEDs can also have first and second contacts, and some embodiments of the present invention can comprise LEDs having lateral geometry wherein both contacts are accessible from one surface of the LEDs as further described below. In other embodiments, the LEDs can have vertical geometry with a first contact on one surface and a second contact on an opposite surface. In one such embodiment, one of the contacts can be on the growth substrate, or the n-type layer when the growth substrate is removed. The other contact can be on the LED's top layer, which is typically a p-type layer.

The first and second contacts can comprise many different materials such as Au, copper (Cu) nickel (Ni), indium (In), aluminum (Al) silver (Ag), or combinations thereof. Still other embodiments can comprise conducting oxides and transparent conducting oxides such as indium tin oxide, nickel oxide, zinc oxide, cadmium tin oxide, titanium tungsten nickel, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, $LaCuOS$, $CuGaO_2$ and $SrCu_2O_2$. The choice of material used can depend on the location of the contacts as well as the desired electrical characteristics such as transparency, junction resistivity and sheet resistance. In the case of Group-III nitride devices, it is known that a thin semitransparent current spreading layer typically can cover some or all of the p-type layer 18. It is understood that the second contact can include such a layer which is typically a metal such as platinum (Pt) or a transparent conductive oxide such as indium tin oxide (ITO), although other materials can also be used. The LEDs can also comprise additional current spreading structures or grids.

In 14 a single crystalline phosphor is formed using known processes, with the single crystalline phosphor providing one or more phosphors in periodic lattice or structure with subatomic spacing. Single crystals are crystalline solids in which the crystal lattice is continuous and unbroken to the edges of the crystal with no grain boundaries. Fabrication of single crystals typically involves the building of a crystal, layer by layer of atoms. Techniques to produce large singe crystals include slowly drawing a rotating "seed crystal" in a molten bath of feeder material. Processes utilizing these techniques are known in the art as the Czochralski process or the Bridgeman technique.

In one embodiment, the single crystalline phosphor comprises many different compositions and phosphor materials alone or in combination. In one embodiment the single crystalline phosphor can comprise yitrium aluminum garnet (YAG, with chemical formula $Y_3Al_5O_{12}$). YAG single crystalline phosphors are commercially available from VLOC Subsidiary of II-IV Incorporated. The YAG host is a stable compound that is mechanically robust, physically hard and optically isotropic.

The YAG host can be combined with other compounds to achieve the desired emission wavelength. In one embodiment where the single crystalline phosphor absorbs blue light and re-emits yellow, the single crystalline phosphor can comprise YAG:Ce. This embodiment is particularly applicable to LEDs that emit a white light combination of blue and yellow light.

A full range of broad yellow spectral emission is possible using conversion particles made of phosphors based on the $(Gd,Y)_3(Al,Ga)_5O_{12}$:Ce system, which include $Y_3Al_5O_{12}$:Ce (YAG). Other yellow phosphors that can be used for white emitting LED chips include:

$Tb_{3-x}RE_xO_{12}$:Ce(TAG); RE=Y, Gd, La, Lu; or $Sr_{2-x-y}Ba_xCa_ySiO_4$:Eu.

In other embodiments other compounds can be used with YAG host for absorption and re-emission of different wavelengths of light. For example, a YAG:Nb single crystal phosphor can be provided to absorb blue light and re-emit red light. First and second phosphors can also be combined for higher CRI white of different white hue (warm white) with the yellow phosphors above combined with red phosphors. Different red phosphors can be used including: $Sr_xCa_{1-x}S$:Eu, Y; Y=halide;

$CaSiAlN_3$:Eu; or $Sr_{2-y}Ca_ySiO_4$:Eu

Other phosphors can be used to create saturated color emission by converting substantially all light to a particular color. For example, the following phosphors can be used to generate green saturated light:

$SrGa_2S_4$:Eu;

$Sr_{2-y}Ba_ySiO_4$:Eu; or $SrSi_2O_2N_2$:Eu.

The following lists some additional suitable phosphors that can be used as conversion particles, although others can be used. Each exhibits excitation in the blue and/or UV emission spectrum, provides a desirable peak emission, has efficient light conversion, and has acceptable Stokes shift:

Yellow/Green $(Sr,Ca,Ba) (Al,Ga)_2S_4$:$Eu^{2+}$ $Ba_2 (Mg,Zn) Si_2O_7$:$Eu^{2+}$ $Gd_{0.46}Sr_{0.31}Al_{1.23}O_xF_{1.38}$:$Eu^{2+}_{0.06}$ $(Ba_{1-x-y}Sr_xCa_y) SiO_4$:Eu $Ba_2SiO_4$:$Eu^{2+}$

RED $Lu_2O_3$:$Eu^{3+}$ $(Sr_{2-x}La_x) (Ce_{1-x}Eu_x) O_4$ $Sr_2Ce_{1-x}Eu_xO_4$ $Sr_{2-x}Eu_xCeO_4$ $SrTiO_3$:$Pr^{3+}$,$Ga^{3+}$ $CaAlSiN_3$:$Eu^{2+}$ $Sr_2Si_5N_8$:$EU^{2+}$

In some manufacturing processes, single crystals are formed in boules from which the single crystal phosphors according to the present invention can be separated. In one embodiment, circular single crystal phosphor of different thicknesses and diameters can be cut from the boule. In some embodiments, the single crystal phosphor can have thicknesses in the range 0.5 to 1 mm, and a diameter of approximately 6 mm. It is understood, however, that the single crystal phosphor can have different thicknesses and have a diameter of more than 2 cm depending on the fabrication process.

As an embodiment, the doping concentration of the active element (e.g. Ce in YAG:Ce) can be graded in the YAG single crystal, such as vertically through the thickness or laterally along the width, or a combination of both. The gradient can be linear or parabolic or any other function or shape. The gradient can be formed in different ways, such as in the single crystal during formation of the boule from which the single crystals are separated.

In 16, the single crystalline phosphor is bonded to the LED wafer using known wafer bonding techniques. The single crystalline phosphor is arranged so that in the final LED devices, light emitted from the LED passes through the single crystalline phosphor where at least some of the LED light is absorbed and re-emitted at a different wavelength of light. As mentioned above, different embodiments of the present invention can emit a white light combination of LED light and re-emitted light from the single crystal.

In 18, the single crystalline phosphor can go through an optional process of being ground or planarized to control the amount of phosphor particles that the LED light passes through. This can be done to control the amount of light converted by the single crystalline phosphor, with less of the LED typically being converted when passing through thinner crystals. This can be used to control the end emission color point of the LED. In other embodiments, the single crystalline phosphor can be textured or shaped to further reduce TIR and improve light extraction. Similarly, the surface of the LEDs can be textured to improve light extraction. It is understood that in different embodiment the single crystalline phosphor can be ground, planarized, textured or shaped before being wafer mounted to the LED wafer.

In an alternative step (not shown) the wafer can be probed using known processes to measure the output lighting characteristics of the LED chips across the wafer. When probed an electrical signal is applied to each of LEDS causing them to emit light, and the output emission characteristics are measured. In different probing steps, the entire wafer can be activated and the output of LEDs measured, LEDs within different regions or groups can be activated and its output measured, or each LED can be individually activated and its output measured. Based on the results of probing, the single crystalline phosphor can be further ground or planarized.

In 20 the individual LED chips can be singulated from the wafer using known methods such as dicing, scribe and breaking, or etching. As described above, the single crystalline phosphor is particularly applicable to being separated or broken along its natural cleavage plane. If the cleavage planes align with the desired separation boundaries, this can be the most convenient singulation process. Scribe, breaking or etching may also be needed to singulate through the remaining layers of the LED. The singulating process separates each of the LED chips with each having substantially the same emission characteristics. This allows for reliable and consistent fabrication of LED chips having similar emission characteristics. Following singulating, in 22 the LED chips can be mounted in a package, or to a submount or printed circuit board (PCB) without the need for further processing to add phosphor. In one embodiment the package/submount/PCB can have conventional package leads with the LED connected to the leads without the need for wire bonds. A conventional encapsulation can then surround the LED chip and electrical connections. In another embodiment, the LED chip can be enclosed by a hermetically sealed cover with an inert atmosphere surrounding the LED chip at or below atmospheric pressure.

Figure 2:
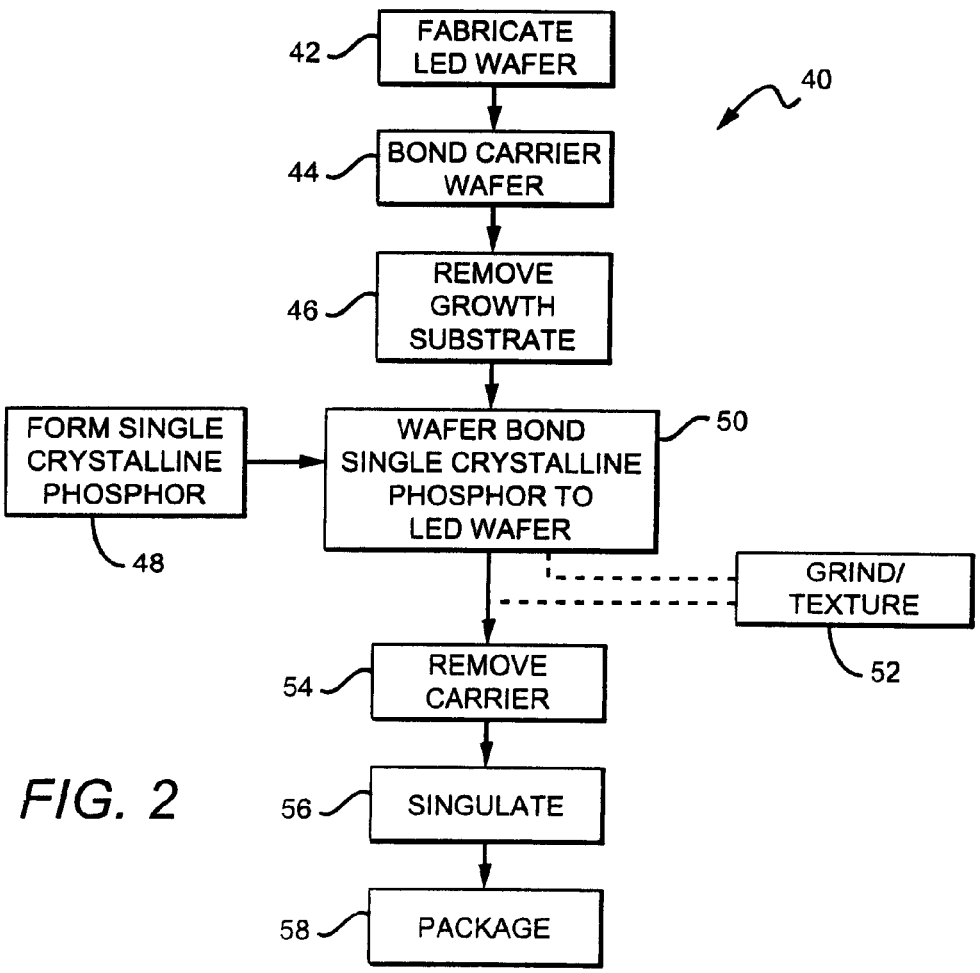
FIG. 2 is a flow diagram for another embodiment of a method for fabricating LED chips according to the present invention.

It is understood that additional steps can be included in the different embodiments of the methods according to the present invention. FIG. 2 shows another embodiment of a method 40 for fabricating LED chips according to the present invention having some steps similar to those described above and shown in FIG. 1. In 42 LEDs formed on a wafer as described above and in 44 the LED wafer is temporarily bonded to a carrier wafer. Different LEDs can be formed on the wafer as described above, including lateral geometry LEDs. Many different carrier wafers of different materials can be used, with the preferred carrier wafer comprising a semiconductor material such as silicon. The LED wafer can be bonded to the carrier wafer using known bonding techniques such as wafer bonding.

In 46 the growth substrate can be removed by the LED revealing the surface of the layer previously adjacent to the growth substrate. Many different substrate removal processes can be used including known grinding and/or etching processes. In other embodiments, the growth substrate or at least portions thereof can remain, such as by thinning the growth substrate. In other embodiments the growth substrate or the remaining portions thereof can be shaped or textured.

In 48, a single crystalline phosphor can be formed as described above in 14 of method 10 in FIG. 1. In 50, the single crystalline phosphor can then be bonded to the surface of the LED exposed when the growth substrate is removed, with the preferred bonding process being wafer bonding processes as described above. In 52 the single crystalline phosphor can be ground, planarized, textured or shaped as described above.

In 54 the carrier wafer can be debonded or removed from the LED wafer using known processes. In this embodiment the single crystalline phosphor not only serves as the medium for converting LED light, but it also serves as mechanical support for the LED. That is, the single crystalline phosphor is robust enough to serve as the mechanical support for the LED so that a carrier substrate is not needed. The LED fabricated according to method 40 can be provided without a growth substrate or a carrier substrate. This provides for a number of advantages such as providing thinner devices and because the substrate may not exhibit good thermal conduction, its removal provides may improve thermal conduction away from the LEDs. In still other embodiments, a portion of the carrier substrate can remain on the LED to provide a reflective layer to reflect LED light back through the single crystalline phosphor. In 56, the LEDs can be singulated from the wafer and in 58 the LEDs can be packaged as described above.

It is understood that the method 40 can comprise additional steps such as texturing, grinding or shaping of the single crystalline substrate, or texturing of the surfaces of the LEDs. When the surfaces of the LEDs are textured, a thicker or additional bonding layer may be needed to securely bond the single crystalline phosphor to the LEDs. The method 40 can also include probing steps as described above.

In other methods according to the present invention the single crystalline phosphor can be mounted to different surfaces, and can include conductive openings or conductive vias in those embodiments where contact is made through the single crystalline phosphor. It also understood that the growth substrate can be removed, thinned or textured at different points in other methods. In still other embodiments single crystalline phosphors can be mounted to multiple surfaces such as by bonding single crystalline phosphors on the top and bottom of the LEDs, with the LED sandwiched between the single crystalline phosphors. This can be done with or without the growth and carrier substrates removed and these embodiments can comprise vias for making contact to the LEDs through the single crystalline phosphor.

Figure 3A:
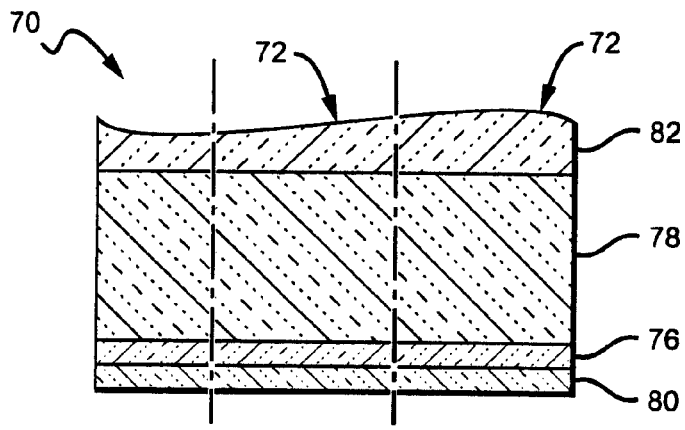
FIGS. 3a through 3i show one embodiment of LED chips according to the present invention at different stages during the fabrication process.

FIGS. 3a through 3i show one embodiment of an LED wafer 70 processes according to the present invention. It is understood that the present invention can be utilized to process many different LEDs embodiments and that individual LEDs or smaller groups of LEDs can be processed similarly to the wafer level LED. Referring now to FIG. 3a, the LED wafer 70 is shown in a flip-chip orientation, and comprises LEDs chips 72 shown at a wafer level of their fabrication process. Phantom lines are included to show separation or dicing line between the LED chips and following additional fabrication steps. FIG. 3a shows only two devices at the wafer level, but it is understood that many more LED chips can be formed from a single wafer. For example, when fabricating LED chips having a 1 millimeter (mm) square size, up to 4500 LED chips can be fabricated on a 3 inch wafer.

Each of the LED chips 72 comprises layers forming semiconductor LEDs that can have many different semiconductor layers arranged in different ways as described above. The layers of the LEDs chips 72 generally comprise an active layer/region 76 sandwiched between first and second oppositely doped epitaxial layers 78, 80, all of which are formed successively on a growth substrate 82 at the wafer level. In the embodiment shown, the first oppositely doped layer 78 is n-type doped, while the second oppositely doped layer is p-type doped. In other embodiments, however, the first and second oppositely doped layers can be doped p- and n-type, respectively.

In the embodiment shown, the LED chips 72 are shown as continuous layers on the substrate 82 with the layers separated into individual devices when the LED chips are singulated. In other embodiments the LED can be formed into separate devices on the growth substrate 82. This separation can be achieved by having portions of the active region 76 and doped layers 78, 80 etched down to the substrate 82 to form the open areas between the LED chips 72. In other embodiments, the etching can pass through only a portion of the LED layers or can pass partially through the growth substrate. The LED chips 72 can be made of different material systems and the substrate can be made of different materials, as described above. It is understood that additional layers and elements can also be included in the LED chips 72 and the active region 76 can comprise many different structures, with the active region as shown comprising a quantum well (QW) structure.

Figure 3B:
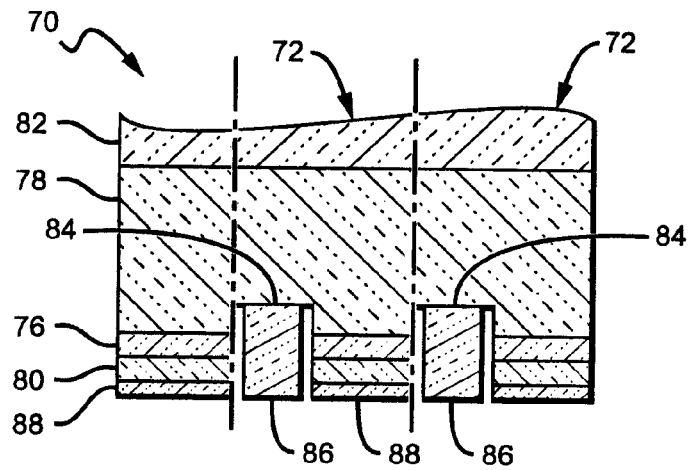

Referring now to FIG. 3b, the LED chips 72 can be formed having lateral geometry, although it is understood that the invention can also be used with LEDs having different layer geometries. For each of the LED chips 72 the p-type layer 80 and active region 76 are etched to form a mesa 84 on the n-type layer 78. An n-type layer contact 86 is formed on the mesa 84 and a p-type layer contact 88 is formed on the p-type layer 80. The p-type contact 88 can also comprise a mirror to reflect light from the LED's active region 76 so that the light can contribute to useful emission. The mirrors can comprise reflective metals or distributed Bragg reflectors (DBRs). Mirrors can also be used in conjunction with the n-type contact 86 to also reflect light for useful emission. Other high reflectivity mirror layers can also be included in different locations to further reflect light for useful emission, such a separate high reflectivity mirror layer (not shown) adjacent the p- and n-type contacts 88, 86.

The n- and p-type contacts 86, 88 can be made of the materials described above, and each of the LEDs chips can also comprise the current spreading layers and structures described above. An electrical signal applied to the n-type contact 86 spreads into the n-type layer 78 and a signal applied to the p-type contact 88 spreads into the p-type layer 80. Because the LED chips 72 have lateral geometry, the contacts 86, 88 are accessible from the same surface.

Figure 3C:
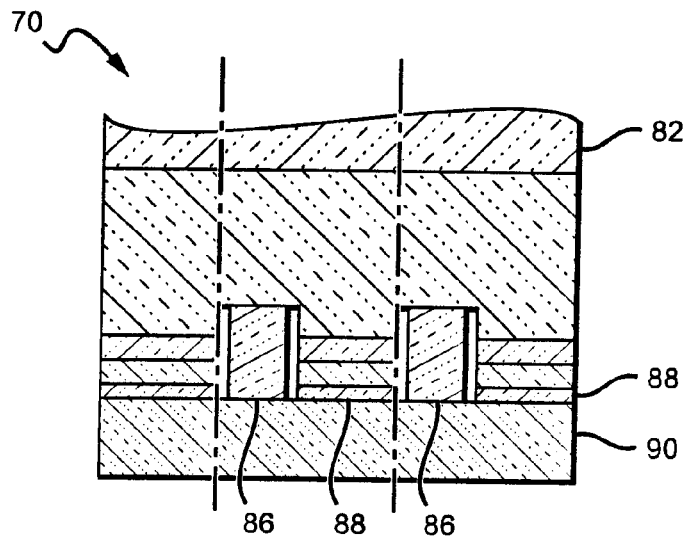

Referring now to FIG. 3c, the LED wafer 70 can be wafer bonded to a carrier wafer/substrate 90 on the surface of the LEDs 72 at the surface where the contacts 86, 88 are accessible. Many different carrier wafers can be used made from many different materials, with a suitable carrier wafer made of silicon (Si). Many different bonding methods can be used such as conventional wafer bonding techniques. It is understood that some LED wafers according to the present invention can be fabricated without a carrier wafer.

Figure 3D:
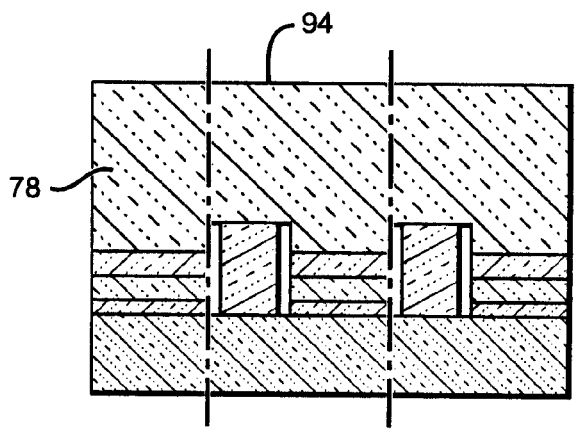
Figure 3E:
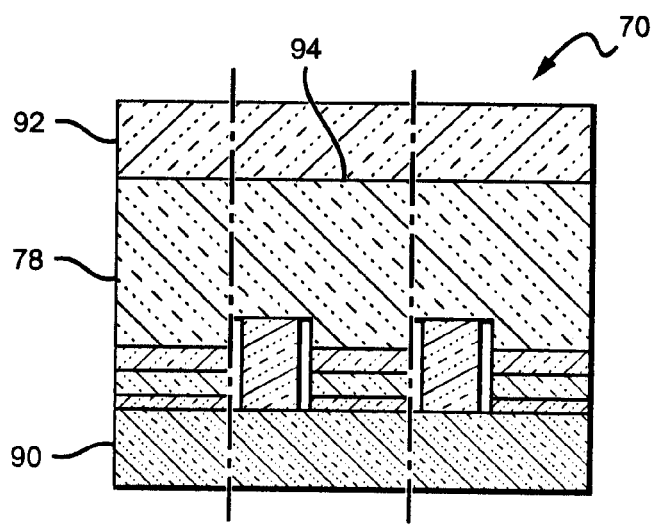

Referring now to FIG. 3d, the growth substrate 82 (shown in FIGS. 3a-3c) can be removed using the substrate removal processes described above. Removal of the growth substrate 82 reveals a top surface 94 of the n-type layer 78, and as shown in FIG. 3e, a single crystalline phosphor 92 is wafer bonded to the surface 94. Many different bonding methods can be used, including but not limited to known wafer bonding methods. The single crystalline phosphor 92 can then be ground to the desired thickness and the top surface of the single crystalline phosphor 92 can be textured to enhance light extraction. In still other embodiments, the surface of the n-type layer 78 revealed after removal of the growth substrate can be textured before bonding of the single crystalline phosphor 92. In these embodiments, a bonding agent, such as an epoxy or silicone, may be needed to ensure that the single crystalline phosphor 92 adheres adequately to the n-type layer 78.

Figure 3F:
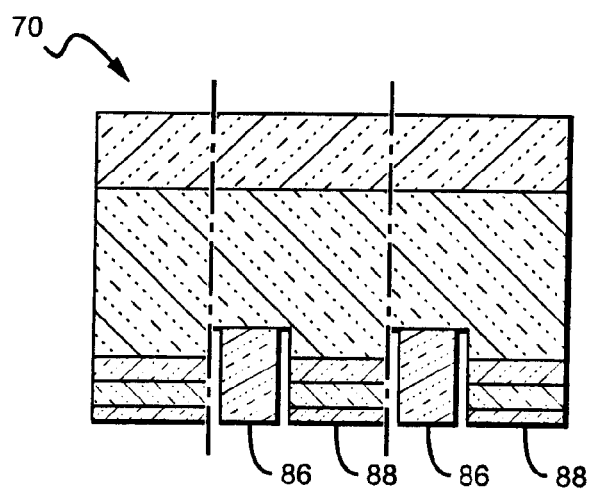

Referring now to FIG. 3f, the carrier wafer 90 (shown in FIGS. 3c to 3e) can be debonded or otherwise removed from the LEDs 72 using known processes, allowing access to the n- and p-type contacts 86, 88. The single crystalline phosphor is typically robust enough to provide sufficient mechanical support to the LEDs 72 after removal of the carrier wafer 90. Removal of the carrier substrate also eliminates a potential path of thermal resistance, such that heat from the LEDs can more readily dissipate.

Figure 3G:
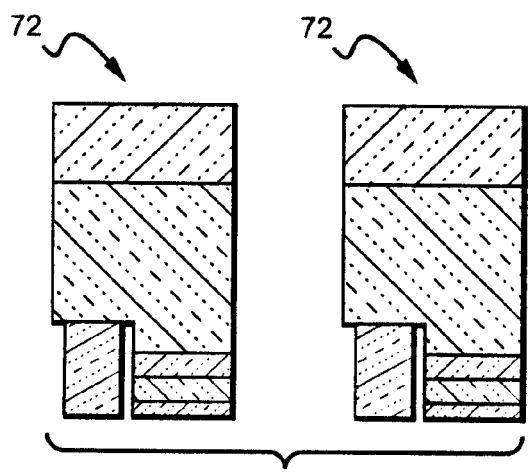

Referring now to FIG. 3g, the LEDs chips 72 are singulated from the LED wafer 70 into individual devices using the singulating or dicing methods described above. The individual LED chips 72 can then be mounted in packages as described above and in FIGS. 3h and 3i. It is understood that in other embodiments the LED chips can be singulated as groups of LED chips 72 that can then be mounted in a package as a group.

The LED chips are particularly applicable to surface mount devices. That is, the LEDs 72 can be mounted in a package without the need for wire bonds, with the n- and p-type contact 86 and 88 being accessible for surface mounting from opposite that single crystalline phosphor 92.

As described above, the LED wafer can be probed, but it is also understood that LED chip, or LED package can be similarly be probed to measure device characteristics such as operating voltage, leakage current, peak and dominant emission wavelength, color-point in the CIE diagram, color rendering index (CRI), correlated color temperature (CCT), color bin, intensity and efficacy. Different probing methods can be used and in one embodiment an electrical signal is applied to each of LEDS causing them to emit light, and the output emission characteristics are measured. The single crystalline phosphor thickness over each of the LED chips can be reduced, if needed, to achieve a target color point by techniques like micromachining, microdrilling, micro sandblasting, etc.

The single crystalline phosphor can be arranged in many different ways and on other surfaces of the LED chips, such as adjacent the p-type oppositely doped layer 80 or on the side surfaces of the LED chip 72. In still other embodiments, the singly crystalline phosphor can have different regions that absorb light from the LED chip 72 and emit different colors of light, or more than one single crystalline phosphor can be used either in a stack or covering different portions of the LED chip 72.

FIGS. 4a through 4d show another embodiment of an LED wafer 100 similar to the LED chips shown in FIGS. 3a through 3i and for the similar features the same reference numbers are used with the understanding that the description above applies equally to this embodiment. The LED wafer comprises LED chips 102 having an active region 76 between and n-type and p-type layers 78, 80. The p-type layer 80 and active region 76 are etched to form mesa 84 in the n-type layer 78, with an n-type contact 86 being on the mesa 84 and an p-type contact 88 on the p-type layer. The LED chips 102 are shown following removal of the growth substrate (and the carrier wafer 90 if utilized). In this embodiment, the LED chips 102 include first and second single crystalline phosphors 104, 106 each of which absorbs LED light and re-emits a different color of light. In the embodiment shown the crystalline phosphors 104, 106 are formed separately and then bonded one over the other to the surface of the n-type layer 78 exposed by removal of the growth substrate. In other embodiments the phosphors 102, 104 104, 106 can be formed as a one single crystalline phosphor having different regions for re-emitting different colors of light.

Figure 4A:
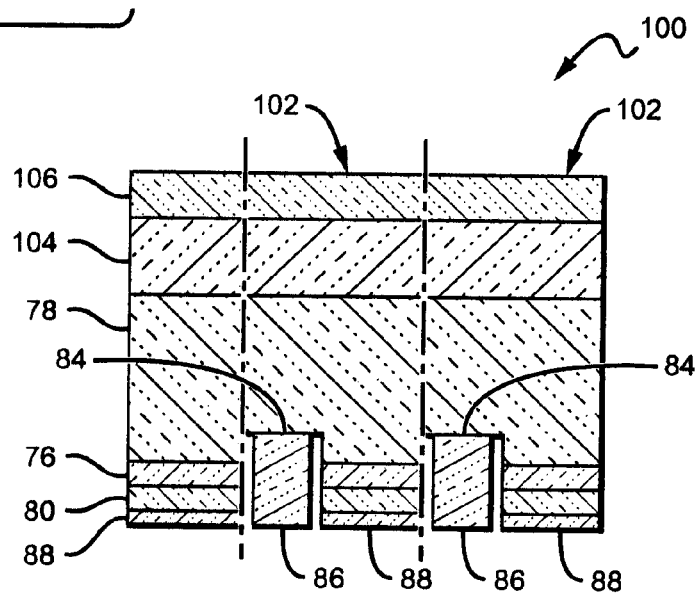
FIGS. 4a through 4d show another embodiment of an LED chip according to the present invention.
Figure 4B:
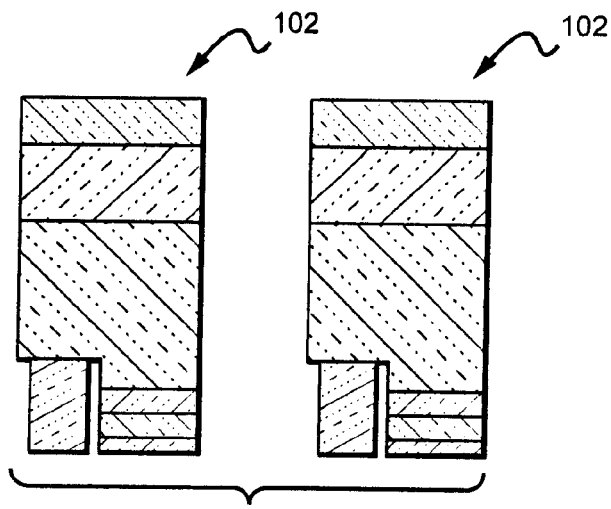

The single crystalline phosphors 104, 106 can re-emit different colors of light depending on the compounds found therein. In the embodiment shown, the first single crystalline phosphor 104 can absorb a fraction of the blue light and re-emit red light, while the second single crystalline phosphor 106 can absorb a fraction of the remaining blue light and re-emit yellow light. This arrangement allows for the LED chips 102 to emit a warm color temperature white light combination of blue, red and yellow light. The yellow emitting single crystalline phosphor 106 can comprise many of the compounds described above, with a suitable compounds being YAG:Ce. The red emitting single crystalline phosphor 104 can comprise many of the compounds described above, with suitable compounds being YAG:Eu or YAG:Tb. It is understood that in other embodiments more than two single crystalline phosphors can be used. Referring now to FIG. 4b, the LED chips 102 can be singulated from the wafer and packaged as described above and in FIGS. 4c and 4d.

Figure 5A:
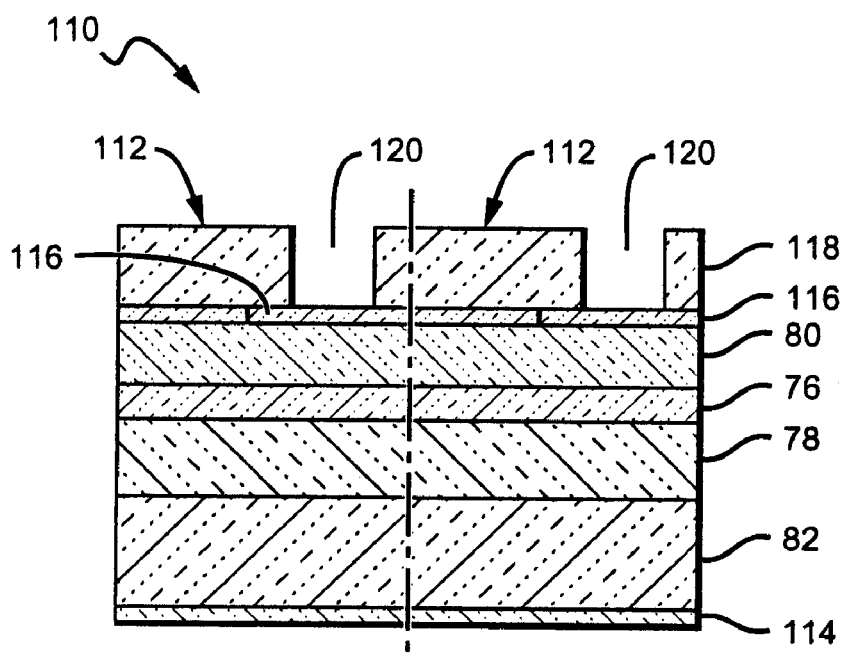
FIGS. 5a and 5b show still another embodiment of an LED according to the present invention.
Figure 5B:
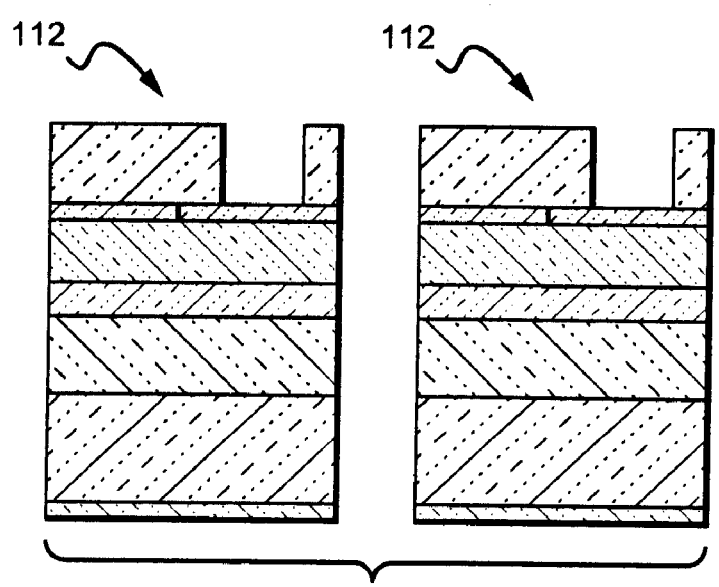

As mentioned above, the present invention can also be used in LED chips having geometries other than lateral geometry. FIGS. 5a and 5b show one embodiment of an LED wafer 110 having vertical geometry LED chips 112. Each of the LED chips 112 comprise an active region 76 between n- and p-type doped layers 78, 80, all formed on a growth substrate 82. In this embodiment the growth substrate 82 is conductive so that the n-type contact 114 can be deposited on the substrate 82. An electrical signal applied to the contact 114 spreads through the substrate 82 to the n-type layer 78. In embodiments where the growth substrate 82 is insulating or not sufficiently conductive, the substrate can be removed and n-type contact 114 can be deposited directly on the n-type layer 78. The n-type layer contact 114 can also comprise a mirror layer. A p-type contact 116 can be deposited directly on the p-type layer with current spreading layers and structures as described above. Like the embodiment above, other high reflectivity mirror layers can also be included in different locations to further reflect light for useful emission.

A single crystalline phosphor 118 can be bonded over the p-type layer 80 with the p-type contact 116 between the single crystalline phosphor 118 and p-type layer 80. To make electrical contact to the p-type contact 116, openings 120 are formed through the single crystalline phosphor 118 either before or after mounting to the LED chips 112. The openings 120 can be formed using many different methods such as etching, laser ablation, drilling, etc. The p-type contacts 116 can then be contacted through the openings 120, such as by wire bonds. Referring now to FIG. 5b, the LED chips 112 can be singulated from the wafer and packaged as described above.

In other embodiments, LED chips with vertical geometry can have a flip-chip orientation with the single crystalline phosphor being mounted over the n-type layer. In the embodiments where the growth substrate remains the growth substrate is between the single crystalline phosphor and the n-type layer. In either case the n-type contact can be between the single crystalline phosphor and the n-type layer so that openings must be formed in the single crystalline phosphor for contacting the n-type contact. As mentioned above, other embodiments can also comprise multiple single crystalline phosphors on different surfaces of the LED, such as by having the LED sandwiched between the single crystalline phosphors.

Figure 3H:
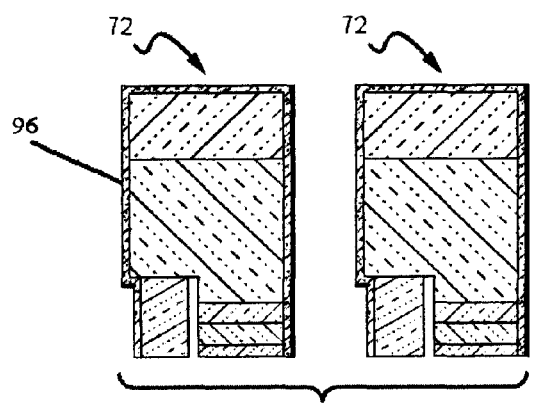
Figure 3I:
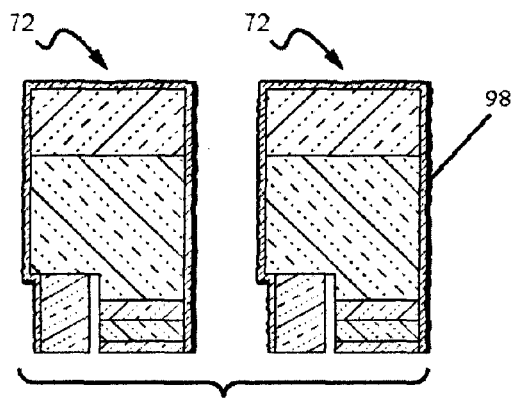
Figure 4C:
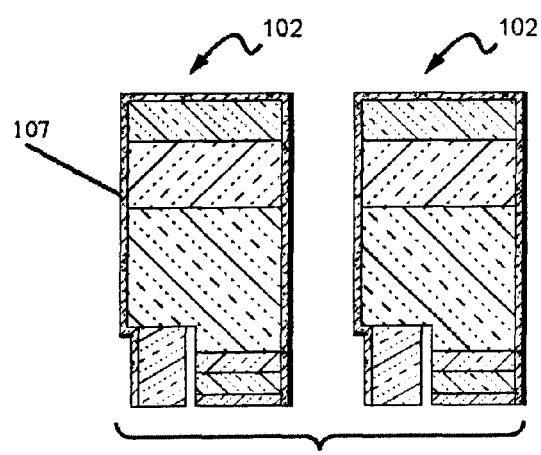
Figure 4D:
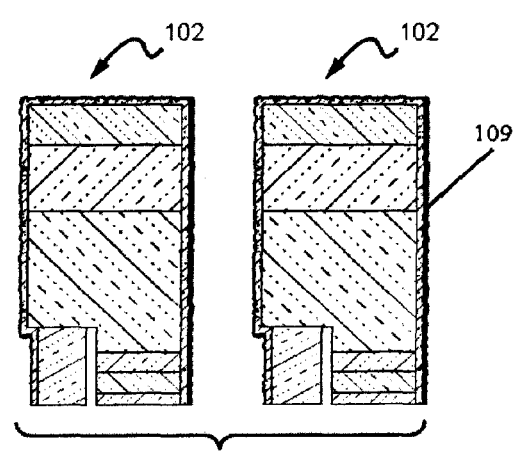

Single crystalline phosphors can in some instances generate spatial color temperature nonuniformity. This can be related to the different path lengths of the photon inside the crystalline phosphor slab due to the absence of scattering within the slab. The color temperature uniformity can be improved by the addition of light scattering particles in the encapsulation surrounding the LED chip, as shown in FIGS. 3h, 3i, 4c and 4d. The scattering particles can be many different sizes such as in the range of 200 nm to 5 μm, although other sizes can also be used. In one embodiment, light scattering particles can also be added during the growth process of the single crystalline phosphor material, so that optimum amount of scattering is achieved within the single crystalline phosphor. In still other embodiments, the surface of the encapsulation can be textured to induce scattering of light, as shown in FIGS. 3i and 4d. In FIGS. 3h and 4c, the respective encapsulation 96, 107 comprising scattering particles surrounds the LED chip and electrical contacts, to which the package leads are affixed. FIGS. 3i and 4d shows another embodiment wherein the respective encapsulation 98, 109 comprising scattering particles and a textured surface surrounds the LED chip and electrical contacts, to which the package leads are affixed.

Although the present invention has been described in detail with reference to certain preferred configurations thereof, other versions are possible. Therefore, the spirit and scope of the invention should not be limited to the versions described above.

I claim:

1. A method for fabricating light emitting diode (LED) chips from a wafer, comprising:
   depositing LED epitaxial layers on an LED growth wafer to form a plurality of LEDs on said growth wafer; and
   bonding a single crystalline phosphor over at least some said plurality of LEDs so that at least some light from the covered ones of said LEDs passes through said single crystalline phosphor and is converted.

2. The method of claim 1, further comprising planarizing said single crystalline phosphor.

3. The method of claim 1, further comprising removing said growth wafer from said plurality of LEDs.

4. The method of claim 1, wherein said single crystalline phosphor provides mechanical support for said LED epitaxial layers.

5. The method of claim 1, wherein a surface of said single crystalline phosphor is textured.

6. The method of claim 1, further comprising etching said LEDs to form lateral geometry devices, and depositing first and second contacts on said LEDs, wherein said single crystalline phosphor is bonded to a surface opposite said first and second contacts.

7. The method of claim 1, further comprising forming openings in said single crystalline phosphor to access contacts on said LEDs.

8. The method of claim 3, further comprising mounting said LED wafer to a carrier wafer.

9. The method of claim 8, further comprising removing said carrier wafer following said bonding of said single crystalline phosphor.

10. The method of claim 1, wherein said LED chips emit white light.

11. The method of claim 1, wherein said single crystalline phosphor comprises a yttrium aluminum garnet (YAG) host lattice.

12. The method of claim 11, wherein said single crystalline substrate further comprises a phosphor.

13. The method of claim 12, wherein the concentration of said phosphor is graded in said single crystalline substrate.

14. The method of claim 1, wherein said single crystalline substrate further comprises scattering particles.

15. The method of claim 1, further comprising singulating said LEDs from said wafer as individual LED chips or groups of LED chips.

16. A light emitting diode (LED) chip wafer, comprising:
   a plurality of LEDs on a wafer;
   a first single crystalline phosphor at least partially covering at least some of said LEDs such that during operation of the covered ones of said LEDs at least some light from said LEDs passes through said single crystalline phosphor and is converted.

17. The LED chip wafer of claim 16, wherein said first single crystalline phosphor provides mechanical support for at least some of said LEDs.

18. The LED chip wafer of claim 16, wherein said LEDs covered by said first single crystalline phosphor emit a white light combination of light from said LED and converted light from said first single crystalline phosphor.

19. The LED chip wafer of claim 16, wherein said first single crystalline phosphor comprises yttrium aluminum garnet (YAG).

20. The LED chip wafer of claim 19, wherein said first single crystalline phosphor further comprises a phosphor.

21. The LED chip wafer of claim 20, wherein the concentration of said phosphor is graded in said first single crystalline phosphor.

22. The LED chip wafer of claim 16, wherein said first single crystalline phosphor further comprises light scattering materials.

23. The LED chip wafer of claim 16, wherein said first single crystalline substrate further comprises a phosphor to absorb light from said LED and emit yellow light.

24. The LED chip wafer of claim 16, capable of being separated into LED chips.

25. The LED chip wafer of claim 16, wherein said LED covered by said first single crystalline phosphor emits a white light combination of LED light and down-converted light from said single crystalline phosphor.

26. The LED chip wafer of claim 16, wherein said LEDs further comprise contacts and said first single crystalline phosphor comprises openings to at least some of said contacts.

27. The LEDs chip wafer of claim 16, wherein said LEDs have lateral geometry and contacts.

28. The LED chip wafer of claim 27, wherein said first single crystalline phosphor covers said LEDs on a surface opposite the surface from which said contacts are accessed.

29. The LED chip wafer of claim 16, further comprising covering a least some of said LED with a second single crystalline phosphor.

30. The LED chip wafer of claim 16, wherein said LED wafer is sandwiched between said first and second single crystalline phosphors.

31. The LED chip wafer of claim 16, wherein said single crystalline phosphor is textured.

32. A method for fabricating light emitting diode (LED) chips from a wafer, comprising:

depositing LED epitaxial layers on an LED growth substrate to form an LED wafer with a plurality of LEDs;

bonding said LED wafer to a carrier wafer;

removing said LED growth substrate;

bonding a single crystalline phosphor over at least some of said plurality of LEDs so that light from at least some of said LEDs passes through said single crystalline phosphor and is converted; and removing said carrier wafer.

33. The method of claim 32, further comprising planarizing said single crystalline phosphor.

34. The method of claim 32, wherein said single crystalline phosphor provides mechanical support for said LED epitaxial layers.

35. The method of claim 32, wherein a surface of said single crystalline phosphor is textured.

36. The method of claim 32, wherein said LED chips emit white light.

37. The method of claim 32, wherein said single crystalline phosphor comprises a yttrium aluminum garnet (YAG).

38. The method of claim 32, wherein said single crystalline substrate further comprises a phosphor.

39. The method of claim 32, further comprising singulating said LEDs from said wafer as individual LED chips or groups of LED chips.

40. The method of claim 32, further comprising forming a high reflectivity mirror on said LED epitaxial layers opposite to the said single crystalline.

* * * * *